United States Patent
Yoshino et al.

(10) Patent No.: US 7,332,106 B2
(45) Date of Patent: Feb. 19, 2008

(54) LIGHT-EMITTING DEVICE AND PHOSPHOR

(75) Inventors: Masahiko Yoshino, Yokohama (JP); Naoto Kijima, Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 11/361,981

(22) Filed: Feb. 27, 2006

(65) Prior Publication Data

US 2006/0145593 A1 Jul. 6, 2006

Related U.S. Application Data

(63) Continuation of application No. PCT/JP2004/012304, filed on Aug. 26, 2004.

(30) Foreign Application Priority Data

Aug. 28, 2003 (JP) ............... 2003-305020
Oct. 21, 2003 (JP) ............... 2003-361114

(51) Int. Cl.
*H01L 33/00* (2006.01)
*C09K 11/80* (2006.01)

(52) U.S. Cl. ............... 252/301.4 R; 313/503; 257/98

(58) Field of Classification Search ......... 252/301.4 R; 313/503; 257/98
See application file for complete search history.

(56) References Cited

U.S. PATENT DOCUMENTS

| | | | |
|---|---|---|---|
| 3,564,322 A * | 2/1971 | Blasse et al. ............... 313/468 |
| 4,024,070 A * | 5/1977 | Schuil .................. 252/301.4 R |
| 4,727,283 A * | 2/1988 | van Kemenade et al. ... 313/487 |
| 5,998,925 A * | 12/1999 | Shimizu et al. ............. 313/503 |
| 6,066,861 A | 5/2000 | Hohn et al. |
| 6,069,440 A | 5/2000 | Shimizu et al. |
| 6,245,259 B1 | 6/2001 | Hohn et al. |
| 6,277,301 B1 | 8/2001 | Hohn et al. |
| 6,538,371 B1 * | 3/2003 | Duggal et al. ............... 313/486 |
| 6,552,487 B1 | 4/2003 | Ellens et al. |
| 6,576,930 B2 | 6/2003 | Reeh et al. |
| 6,592,780 B2 | 7/2003 | Hohn et al. |
| 6,596,195 B2 | 7/2003 | Srivastava et al. |
| 6,608,332 B2 | 8/2003 | Shimizu et al. |
| 6,613,247 B1 | 9/2003 | Hohn et al. |
| 6,614,179 B1 | 9/2003 | Shimizu et al. |
| 6,669,866 B1 * | 12/2003 | Kummer et al. ...... 252/301.4 R |
| 6,812,500 B2 | 11/2004 | Reeh et al. |
| 6,960,878 B2 | 11/2005 | Sakano et al. |

(Continued)

FOREIGN PATENT DOCUMENTS

DE 199 34 126 A1 1/2001

(Continued)

*Primary Examiner*—C. Melissa Koslow
(74) *Attorney, Agent, or Firm*—Oblon, Spivak, McClelland, Maier & Neustadt, P.C.

(57) ABSTRACT

The present invention provides a light-emitting device having an excitation source which emits a light having a wavelength of from 420 to 500 nm and a phosphor in combination, and having a high luminance.

A light-emitting device having a first illuminant which emits a light having a wavelength of 420 to 500 nm and a second illuminant which emits a visible light when irradiated with the light from the first illuminant, characterized in that the second illuminant contains a phosphor, and the object color of the phosphor satisfies $L^* \geq 90$, $-22 \leq a^* \leq -10$, and $b^* \geq 55$, in the $L^*$, $a^*$, $b^*$ color system.

14 Claims, 2 Drawing Sheets

U.S. PATENT DOCUMENTS

| | | |
|---|---|---|
| 6,998,771 B2 * | 2/2006 | Debray et al. .............. 313/503 |
| 7,078,732 B1 | 7/2006 | Reeh et al. |
| 2001/0030326 A1 | 10/2001 | Reeh et al. |
| 2001/0045647 A1 | 11/2001 | Hohn et al. |
| 2004/0000868 A1 | 1/2004 | Shimizu et al. |
| 2004/0004437 A1 | 1/2004 | Shimizu et al. |
| 2004/0016908 A1 | 1/2004 | Hohn et al. |
| 2004/0079956 A1 | 4/2004 | Kummer et al. |
| 2004/0084687 A1 | 5/2004 | Hohn et al. |
| 2004/0090180 A1 | 5/2004 | Shimizu et al. |
| 2004/0222435 A1 | 11/2004 | Shimizu et al. |
| 2005/0127385 A1 | 6/2005 | Reeh et al. |
| 2005/0145868 A1 | 7/2005 | Kummer et al. |
| 2005/0161694 A1 | 7/2005 | Reeh et al. |
| 2005/0224821 A1 | 10/2005 | Sakano et al. |
| 2005/0231953 A1 | 10/2005 | Reeh et al. |
| 2005/0280357 A1 | 12/2005 | Shimizu et al. |

FOREIGN PATENT DOCUMENTS

| | | | |
|---|---|---|---|
| JP | 49-1221 | | 1/1974 |
| JP | 49-1221 B | * | 1/1974 |
| JP | 10-190066 | | 7/1998 |
| JP | 10-242513 | | 9/1998 |
| JP | 10-247750 | | 9/1998 |
| JP | 2003-505582 | | 2/2003 |
| JP | 2003-505583 | | 2/2003 |
| WO | WO 01/08452 | | 2/2001 |
| WO | WO 01/08453 | * | 2/2001 |
| WO | WO 02/059982 A1 | | 8/2002 |

* cited by examiner

LIGHT-EMITTING DEVICE AND PHOSPHOR

TECHNICAL FIELD

The present invention relates to a light-emitting device. More particularly, it relates to a light-emitting device which is capable of generating a highly efficient white emission by a combination of a first illuminant which emits a light in a blue range from an electric power source and a second illuminant containing a wavelength conversion material which absorbs such an emission and emits a yellow light, and a phosphor.

BACKGROUND ART

Light-emitting diodes (LED) or laser diodes (LD) have been developed, which emit lights ranging from a blue to red visible range to violet or ultraviolet. A display device using such multicolor LEDs in combination is used for displays or traffic signals. Further, a light-emitting device has also been proposed, in which the luminescent color of a LED or an LD is changed by a phosphor. For example, JP-B-S49-1221 discloses a method wherein a laser beam which emits a radiation beam having a wavelength of from 300 to 530 nm, is applied to a phosphorescent material ($Ln_{3-x-y}Ce_xGd_yM_{5-z}Ga_zO_{12}$ (Ln represents Y, Lu or La, M represents Al, Al—In or Al—Sc, x is from 0.001 to 0.15, y is at most 2.999, and z is at most 3.0) to let it emit a light to form a display.

Further, in recent years, as an emission source for an image display device or an illumination device, a light-emitting device for white emission is proposed, which is constituted by a combination of a gallium nitride (GaN) type LED or LD having high luminous efficiency and having attracted attention as a semiconductor emission element of a blue light and a phosphor as a wavelength conversion material. JP-A-10-190066 discloses a white light-emitting device wherein a blue LED or a LD chip made of a nitride type semiconductor is used in combination with a phosphor having a part of Y in a cerium-activated yttrium.aluminum.garnet phosphor substituted by Lu, Sc, Gd or La, so that the blue light and a yellow light emitted from the phosphor are color-mixed to form white emission. JP-A-10-247750 discloses a color-conversion mold member, a LED lamp, etc. obtained by a combination of yttrium.aluminum oxide fluorescent materials activated with cerium, which have at least one element component selected from the group consisting of Ba, Sr, Mg, Ca and Zn, and/or a Si element component.

Further, JP-A-10-242513 discloses a phosphor having a part of Y in a cerium-activated yttrium.aluminum.garnet phosphor substituted by Sm. Further, JP-A-2003-505582 or JP-A-2003-505583 discloses the effects of a phosphor having Tb added to a cerium-activated yttrium.aluminum.garnet phosphor.

However, in such a combination of the cerium-activated yttrium.aluminum.garnet phosphor and a blue LED or a blue laser as disclosed above, the emission intensity of white is still insufficient, and therefore, improvement in the efficiency of the blue LED has been required. However, also with regard to such a phosphor, the emission intensity is still insufficient, and therefore, further improvement in the efficiency has been required to realize energy-saving illumination.

Further, with regard to the temperature characteristics, when the LED or the LD as the first illuminant turns on, the ambient temperature of the chip increases, whereby the efficiency of the LED or the LD tends to decrease, and also the phosphor contained in the second illuminant, tends to lose its luminance substantially due to such temperature increase. Usually, the qualities change according to the composition of the host material, and the type and the amount of the activator, and therefore, it is required to employ a material having high emission intensity and a small decrease in the emission intensity due to such temperature increase.

With regard to the afterglow characteristics, especially in a case where the LED or the LD as the first illuminant is used for a display or a back light by means of pulse driving, if the afterglow time of the phosphor contained in the second illuminant is extremely short, there will be a problem such that flickering results and no adequate image characteristics can be obtained, and thus, the improvement is required.

DISCLOSURE OF THE INVENTION

Problems that the Invention is to Solve

The present invention has been made to develop a further bright light-emitting device in an emission system which produces a white light by letting a yellow phosphor emit light by means of a blue LED or LD, and particularly, it is an object of the present invention to provide a light-emitting device having a high luminance by developing a yellow phosphor having high efficiency, and a phosphor having a high luminance.

Means of Solving the Problems

The present inventors have conducted extensive studies to solve the above problems, and as a result, in a study for improvement of the luminous efficiency primarily for a conventional cerium-activated yttrium.aluminum.garnet phosphor, they have found that the object colors remarkably vary even when phosphors have all the same compositions and the same crystal systems, and that there is a strong correlation between the object color of a phosphor and the luminance when it is mounted in an LED, and therefore, when a fluorescent powder having an object color of a specific tendency, i.e. a fluorescent powder having the same levels of L* and a* but having b* made higher by at least a specific value as compared with the conventional phosphor, is used, the luminance of the LED tends to be high. The present invention has been accomplished on the basis of these discoveries. Further, they have found that, in order to bring the object color of the phosphor powder in a specific color range, the conditions primarily for the temperature and the atmosphere during firing may be optimized, whereby it becomes possible to obtain a phosphor having an object color which is better than ever, and a light-emitting device using such a phosphor has a high luminance and further has high temperature characteristics or afterglow characteristics. Thus, the present invention has been accomplished on the basis of these discoveries.

Namely, the present invention provides a light-emitting device having a first illuminant which emits a light having a wavelength of from 420 to 500 nm and a second illuminant which emits a visible light when irradiated with the light from the first illuminant, characterized in that the second illuminant contains a phosphor, and the object color of the phosphor satisfies L*≧90, −22≦a*≦−10, and b*≧55, in the L*, a*, b* color system, and a phosphor which has an object color satisfying L*≧90, −22≦a*≦−10, and b*≧55, in the L*, a*, b* color system, characterized in that it contains a crystal phase having a chemical composition of the following formula [1]:

$$(Ln_{1-a-b}Ce_aTb_b)_3M_5O_{12} \qquad \text{Formula [1]}$$

wherein Ln is at least one element selected from the group consisting of Y, Gd, Sc, Lu and La, M is at least one element selected from the group consisting of Al, Ga and In, and a and b are numbers which satisfy 0.001≦a≦0.3, and 0≦b≦0.5, respectively.

EFFECT OF THE INVENTION

According to the present invention, it is possible to provide a light-emitting device having a high luminance, and a phosphor having a high luminance.

DESCRIPTION OF REFERENCE SYMBOLS

Figure 1:
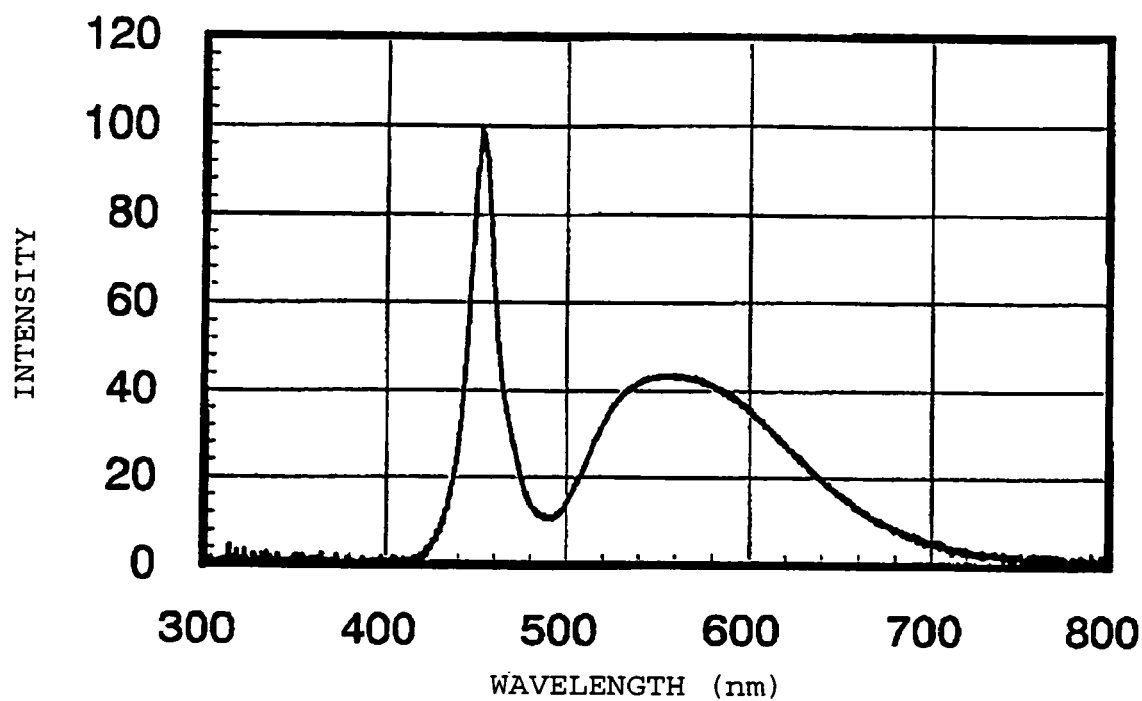
FIG. 1 is an emission spectrum of the phosphor in Example 1 under excitation with 465 nm.

1 Second illuminant
2 Surface-emitting GaN type LD
3 Substrate
4 Light-emitting device
5 Mount lead
6 Inner lead
7 First illuminant (illuminant of from 420 to 500 nm)
8 Resin portion containing the phosphor of the present invention
9 Conductive wire
10 Mold member
11 Surface-emitting illumination device having emission elements mounted therein
12 Casing
13 Emission element
14 Diffuser panel

BEST MODE FOR CARRYING OUT THE INVENTION

The present invention is a light-emitting device having a first illuminant which emits a light having a wavelength of from 420 to 500 nm and a second illuminant containing a phosphor, and the object color of the above phosphor satisfies $L^* \geq 90$, $-22 \leq a^* \leq -10$, and $b^* \geq 55$, in the $L^*$, $a^*$, $b^*$ color system, whereby the emission intensity of the phosphor becomes high, and the light-emitting device has a high luminance. $L^*$ does not usually exceed 100 because such an object that does not emit a light by a irradiated light is treated, but the phosphor of the present invention will be excited by an irradiation light source to emit a light which may be overlapped with a reflected light, so that $L^*$ may exceed 100. Therefore, the upper limit is usually $L^* \leq 110$. Further, from the viewpoint of the high luminance, $a^*$ is preferably $a^* \leq -14$, more preferably $a^* \leq -16$. $b^*$ is preferably $b^* \geq 65$, more preferably $b^* \geq 68$. The present invention is characterized in that the value of $b^*$ is high, and the value $b^*$ should better be high. The upper limit is theoretically $b^* \leq 200$, usually $b^* \leq 120$.

The phosphor contained in the light-emitting device of the present invention is not particularly limited so long as the object color satisfies the above range. However, from the viewpoint of the stability of a material, it is preferably made of an oxide as the host material, and such an oxide more preferably has a garnet structure. Further, it is preferred that the phosphor contains Ce, or Ce and Tb.

Particularly, it is preferred that the phosphor contains a crystal phase having a chemical composition of the following formula [1].

$$(Ln_{1-a-b}Ce_aTb_b)_3M_5O_{12} \qquad \text{Formula [1]}$$

Ln in the formula [1] is at least one element selected from the group consisting of Y, Gd, Sc, Lu and La, and is particularly preferably at least one element selected from Y and Gd.

M in the formula [1] is at least one element selected from the group consisting of Al, Ga and In, and is particularly preferably Al.

a which represents a Ce molar ratio is a number satisfying $0.001 \leq a \leq 0.3$, but from the viewpoint of high emission intensity, the lower limit is preferably $a \geq 0.01$, more preferably $a > 0.01$, furthermore preferably $a \geq 0.02$, and the upper limit is preferably $a \leq 0.2$, more preferably $a \leq 0.18$, furthermore preferably $a \leq 0.15$.

b which represents a Tb molar ratio is a number satisfying $0 \leq b \leq 0.5$, and the emission intensity tends to be high when Tb is contained in the phosphor, and therefore, the lower limit in the range of b is preferably $b \geq 0.01$, more preferably $b > 0.01$, furthermore preferably $b \geq 0.02$, particularly preferably $b > 0.02$.

On the other hand, from the viewpoint of the temperature characteristics, if the ratio of Tb increases, such temperature characteristics tend to decrease and therefore, the upper limit in the range of b is preferably $b < 0.5$, more preferably $b \leq 0.4$, furthermore preferably $b \leq 0.2$, particularly preferably $b \leq 0.17$, most preferably $b < 0.17$. Further, the more the emission intensity of the phosphor under heating is maintained against the emission intensity of the phosphor at room temperature, the higher the temperature characteristics become. The temperature characteristics of the phosphor to be used in the light-emitting device of the present invention was evaluated in such a manner that the phosphor was excited by a light having a wavelength of 465 nm at 100° C., the emission thereby produced was measured, whereupon the value (emission intensity) at the peak top of the emission spectrum of the phosphor, was obtained and then such a value was compared with the value at the peak top of the emission spectrum of the phosphor similarly measured at 25° C., as a standard value. The phosphor to be used in the light-emitting device of the present invention usually has an emission intensity at 100° C. of at least 90% of the emission intensity at 25° C.

Further, from the viewpoint of the afterglowcharacteristics, one containing Tb tends to have good afterglow characteristics, and therefore, the afterglow characteristics will be improved in such a case where the molar ratio b of Tb is adjusted to be preferably $b \geq 0.02$, more preferably $b \geq 0.04$, furthermore preferably $b \geq 0.1$, eparticularly preferably $b \geq 0.2$. Here, the afterglow characteristics are obtained in such a manner that the phosphor is excited, followed by obtaining the time (t1) until the emission intensity of the afterglow after termination of the excitation becomes 1/10 and the time (t2) until the emission intensity of the afterglow becomes 1/100 against the emission intensity immediately before termination of the excitation. The longer the t1 is or the larger the ratio of t2/t1 is, the higher such characteristics become, t1 of the phosphor to be used in the light-emitting device of the present invention is usually at least 155 ns, preferably at least 160 ns, more preferably at least 170 ns, furthermore preferably at least 190 ns, and the upper limit is not particularly limited, but is preferably at most 10 ms because if t1 is too long, the chromaticity characteristics tend to deteriorate due to after-image or color mixture. Further, the ratio of t2/t1 is usually at least 2.05, preferably at least 2.07, more preferably at least 2.15, furthermore preferably at least 2.5, and the upper limit is not particularly limited, but is usually approximately 10. Further, it is preferred that both t1 and t2/t1 satisfy the above ranges.

Further, even when it has the same chemical composition or the crystal structure as the conventional phosphor, the phosphor of the present invention has different values of $L^*$, $a^*$ and $b^*$ due to fine differences in the conditions for the process.

In the phosphor which is contained in the second illuminant of the present invention and which contains a crystal phase as shown in the formula [1], a raw material compound for each element of a Ln source, a Ce source, a Tb source and a M source may, for example, be an oxide, a hydroxide, a carbonate, a nitrate, a sulfate, an oxalate, a carboxylate or a halide of each element, and among them, such a raw material compound is selected in consideration of the reactivity to a composite oxide, non-generation properties of e.g. halogen, NOx and SOx during firing, etc.

As specific examples of the raw material compound of Ln, an Y source compound may, for example, be $Y_2O_3$, $Y(OH)_3$, $YCl_3$, $YBr_3$, $Y_2(CO_3)_3 \cdot 3H_2O$, $Y(NO_3)_3 \cdot 6H_2O$, $Y_2(SO_4)_3$ or $Y_2(C_2O_4)_3 \cdot 9H_2O$, a Gd source compound may, for example, be $Gd_2O_3$, $Gd(OH)_3$, $GdCl_3$, $Gd(NO_3)_3 \cdot 5H_2O$ or $Gd_2(C_2O_4)_3 \cdot 10H_2O$, a La source compound may, for example, be $La_2O_3$, $La(OH)_3$, $LaCl_3$, $LaBr_3$, $La_2(CO_3)_3 \cdot H_2O$, $La(NO_3)_3 \cdot 6H_2O$, $La_2(SO_4)_3$ or $La_2(C_2O_4)_3 \cdot 9H_2O$, a Sc source compound may, for example, be $Sc_2O_3$, $Sc(OH)_3$, $ScCl_3$, $Sc(NO_3)_3 \cdot nH_2O$, $Sc_2(SO_4)_3 \cdot nH_2O$ or $Sc_2(C_2O_4)_3 \cdot nH_2O$, or a Lu source compound may, for example be $Lu_2O_3$, $LuCl_3$, $Lu(NO_3)_3 \cdot 8H_2O$ or $Lu_2(OCO)_3 \cdot 6H_2O$.

As specific examples of the M source compound, with respect to Al, $Al_2O_3$ such as $\alpha$-$Al_2O_3$ or $\gamma$-$Al_2O_3$, $Al(OH)_3$, AlOOH, $Al(NO_3)_3 \cdot 9H_2O$, $Al_2(SO_4)_3$ or $AlCl_3$, may, for example, be mentioned. With respect to Ga, $Ga_2O_3$, Ga(OH)$_3$, $Ga(NO_3)_3 \cdot nH_2O$, $Ga_2(SO_4)_3$ or $GaCl_3$ may, for example, be mentioned, and with respect to In, $In_2O_3$, $In(OH)_3$, $In(NO_3)_3 \cdot nH_2O$, $In_2(SO_4)_3$ or $InCl_3$ may, for example, be mentioned.

Further, as specific examples of an element source compound of Ce or Tb, a Ce source compound may, for example, be $CeO_2$, $Ce_2(SO_4)_3$, $Ce_2(CO_3)_3 \cdot 5H_2O$, $Ce(NO_3)_3 \cdot 6H_2O$, $Ce_2(C_2O_4)_3 \cdot 9H_2O$, $Ce(OH)_3$ or $CeCl_3$, or a Tb source compound may, for example, be $Tb_4O_7$, $Tb_2(SO_4)_3$, $Tb(NO_3)_3 \cdot nH_2O$, $Tb_2(C_2O_4)_3 \cdot 10H_2O$ or $TbCl_3$.

Such materials are sufficiently mixed to be uniform before firing. Specifically, compounds of Y, Gd, Lu, La, Sc, Ce, Tb, Al, Ga and In are pulverized with a dry mill such as a kneader, a stamp mill, a ball mill or a jet mill, as the case requires, and then mixed sufficiently by a mixer such as a V type blender or a conical blender. However, it is also possible to employ a method of carrying out dry pulverization by using a mill after mixing, a method of drying after pulverization and mixing in a medium such as water by using an wet mill, or a method of drying a prepared slurry by e.g. spray drying. Among such pulverization and mixing methods, especially with respect to element source compounds for emission center ions, it is preferred to use a liquid medium because such element source compounds for emission center ions are required to be entirely and uniformly mixed and dispersed in a small amount, and it is preferred to employ such an wet method also from the viewpoint that it is possible to obtain an entirely uniform mixture of other element source compounds.

The material sufficiently and uniformly mixed by one of the above methods is then heated and fired for from 10 minutes to 24 hours at a firing temperature of usually from 1,000 to 1,700° C. in a heat-resistant container such as a crucible or a tray made of alumina or quartz. The lower limit of the firing temperature is preferably at least 1100° C., more preferably at least 1,200° C., and the upper limit is preferably at most 1,600° C., more preferably at most 1,550° C. The firing atmosphere is suitably selected from a single use of air, nitrogen, argon, carbon monoxide or hydrogen, or a gas prepared by mixing nitrogen, argon, etc. Further, an optimal condition of the firing differs depending on materials, the compositional ratios and prepared batch sizes, but reduction firing is usually preferred. In a case where the reduction degree is weak or too strong, the object color does not fall in the range for the object color of the phosphor of the present invention. Usually, the phosphor having the object color defined in the present invention tends to be obtained by adjusting the atmosphere to be a relatively strong reducing atmosphere. Further, there is a case where the higher luminance phosphor can be obtained by selecting a suitable fluxing agent such as $BaF_2$ or $AlF_3$ for use. After the heat treatment, if necessary, washing, dispersion treatment, drying, classification and the like may be carried out.

The particle diameter of the phosphor to be used in the light-emitting device of the present invention is usually from 0.1 μm to 20 μm.

In the present invention, the first illuminant for irradiating the above phosphor with a light, emits a light having a wavelength of from 420 to 500 nm, and it is preferred to use an illuminant which emits a light having a peak wavelength within a wavelength range of from 450 to 485 nm. As a specific example of the first illuminant, a light-emitting diode (LED) or a laser diode (LD) may be mentioned. From the viewpoint of a low power consumption, the laser diode is more preferred. Especially, it is preferred to use a GaN type LED or LD, using a GaN type compound semiconductor. Because such a GaN type LED or LD has remarkably high emission output or external quantum efficiency, and it is possible to obtain a remarkably bright emission with a remarkably low power by the combination with the above phosphor, as compared with e.g. a SiC type LED which emits a light having a wavelength of this range. For example, the GaN type one has an emission intensity at least 100 times the emission intensity of the SiC type one to a current load of 20 mA. Such a GaN type LED or LD preferably has an $Al_xGa_yN$ emission layer, a GaN emission layer or an $In_xGa_yN$ emission layer. The GaN type LED particularly preferably has the $In_xGa_yN$ emission layer among them because the emission intensity is thereby remarkably strong, and the GaN type LD particularly preferably has a multiquantum well structure of the $In_xGa_yN$ layer or the GaN layer because the emission intensity is thereby remarkably strong. Here, the value of x+y in the above is usually in a range of from 0.8 to 1.2. It is preferred that the GaN type LED has Zn or Si doped or no dopant doped in the emission layer, so as to adjust the emission characteristics. The GaN type LED has such an emission layer, a p layer, an n layer, an electrode and a substrate as basic components, and preferably has a hetero structure having the emission layer sandwiched by n type and p type $Al_xGa_yN$ layers, GaN layers, $In_xGa_yN$ layers etc. because of its high luminous efficiency, more preferably has a multiquantum well structure instead of the hetero structure because of its higher luminous efficiency.

In the present invention, it is particularly preferred to use a surface-emitting illuminant, especially a surface-emitting GaN type laser diode as the first illuminant because the luminous efficiency of the entire light-emitting device is thereby increased. The surface-emitting illuminant is an illuminant having a strong emission from its film surface, and in the case of the surface-emitting GaN type laser diode, crystal growth in the emission layer etc., can be suppressed and an emission from the surface rather than from the edge of the emission layer can be strengthened. The use of the surface-emitting one can enlarge the emission cross sectional area per unit amount of emission as compared with the type emitting a light from the edge of the emission layer, and as a result, in a case where the phosphor of the second illuminant is irradiated with the light, an irradiation area can remarkably be enlarged in the same amount of light, and therefore the irradiation efficiency can be increased, whereby it is possible to obtain a further strong emission from the phosphor as the second illuminant.

The phosphor of the second illuminant is not only a phosphor having a specific composition described in the formula [1], but also one containing a plurality of phosphors having different compositional ratios or a mixture having other phosphors combined therewith, whereby it is possible to achieve a more broadened white region and a higher color rendering index. Such other phosphors are not particularly limited. For example, a green phosphor to be used may, for example, be $(Sr,Ca,Mg)Ga_2S_4:Eu$ or $ZnS:Cu,Al$, and a red phosphor to be used may, for example, be $(Ca,Sr)S:Eu$. Further, as a reflection agent or a dispersing agent, a white substance such as $BaSO_4$, $MgO$ or $CaHPO_4$ may be used in combination with the phosphor of the present invention.

A method for combination of such phosphors may, for example, be a method of laminating the respective phosphors in the state of a powder into a film-form, a method of mixing them in a resin, followed by lamination into a film-form, a method of mixing them in the state of a powder, a method of dispersing them in the resin, a method of laminating them into a thin film crystalline form, and it is preferred to use a method of mixing them in the state of a powder, followed by controlling and using the mixture because a white light can thereby be most easily obtained at a low cost.

In a case where a surface-emitting one is used as the first illuminant, it is preferred that the second illuminant is in a film-form. As a result, the light emitted from the surface-emitting illuminant has a sufficiently large cross sectional area, and if the second illuminant is in a film-form in the direction of such a cross section, the area for irradiation of the phosphor from the first illuminant will be large per unit amount of the phosphor, whereby the intensity of a light emitted from the phosphor can be more increased.

Further, in a case where the surface-emitting one is used as the first illuminant and the film-form one is used as the second illuminant, it is preferred to adopt a construction such that the film-form second illuminant is in direct contact with the emission surface of the first illuminant. Here, the contact means a state where the first illuminant and the second illuminant are intimately contacted to each other through no air or gas. As a result, it is possible to avoid a loss of an amount of light such that the light emitted from the first illuminant leaks out by reflection on the film surface of the second illuminant, whereby the luminous efficiency of the entire device can be increased.

Figure 2:
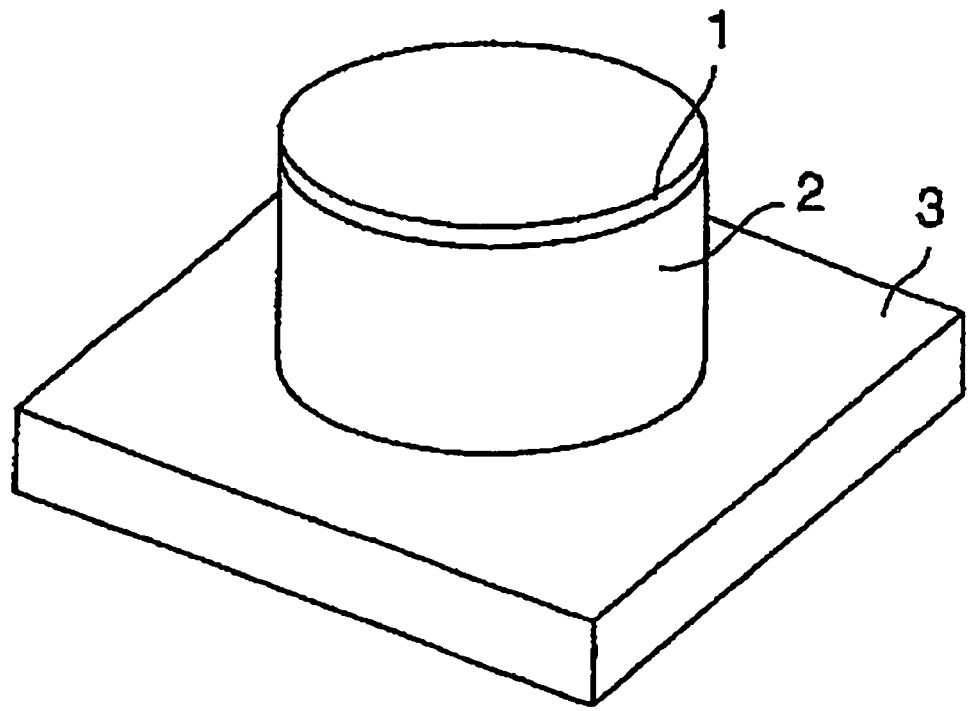
FIG. 2 is a view showing one embodiment of the light-emitting device having a second illuminant in a film form contacted or molded on a surface-emitting GaN type diode.

FIG. 2 is a schematic perspective view which illustrates the positional relationship between the first illuminant and the second illuminant in one embodiment of the light-emitting device of the present invention. In FIG. 2, reference numeral 1 represents the film-form second illuminant having the above phosphor, numeral 2 represents a surface-emitting GaN type LD as the first illuminant, and numeral 3 represents a substrate. In order to achieve conditions where they are contacted each other, LD2 and the second illuminant 1 may separately be prepared, and then the respective surfaces may be contacted by an adhesive or other means, or the second illuminant may be formed (cast) into a film on the &&&emission surface of the LD2. As a result, it becomes possible to accomplish the construction where the LD2 and the second illuminant 1 are contacted to each other.

The light emitted from the first illuminant or the light emitted from the second illuminant is usually directed to every direction, but if a powder of the phosphor in the second illuminant is dispersed in a resin, such a light is partly reflected when it goes out of the resin, whereby the direction of the light can be aligned to some extent. Accordingly, it is possible to align such a light in the direction of the suitable efficiency, to some extent, and therefore, as the second illuminant, it is preferred to use a dispersion having a powder of the above phosphor dispersed in the resin. Further, if the phosphor is dispersed in the resin, the entire area where the second illuminant is irradiated with a light emitted from the first illuminant, will be large, whereby there is such an advantage that it is possible to increase the emission intensity from the second illuminant. The resin to be used in such a case may, for example, be an epoxy resin, a polyvinyl resin, a polyethylene resin, a polypropylene resin or a polyester resin, and is preferably an epoxy resin in that the powder of the phosphor is excellent in dispersibility. In a case where the powder of the second illuminant is dispersed in the resin, the weight ratio of the powder of the second illuminant to the total of the resin and such a powder is usually from 10 to 95%, preferably from 20 to 90%, more preferably from 30 to 80%. If the amount of the phosphor is too large, the luminous efficiency tends to decrease due to agglomeration of the powder, and if it is too small, the luminous efficiency tends to decrease due to light absorption or scattering by such a resin.

The light-emitting device of the present invention comprises the above phosphor as a wavelength conversion material and the emission element which emits a light having a wavelength of from 420 to 500 nm, wherein the above phosphor absorbs a light having a wavelength of from 420 to 500 nm emitted from the emission element, whereby it is possible to emit a white light having a high intensity regardless of the environment. Such a light-emitting device is suitable for a back light source, a light-emitting source for signals, or a light source for an image display device such as a color liquid crystal display device or an illumination device such as a surface emission device.

Figure 3:
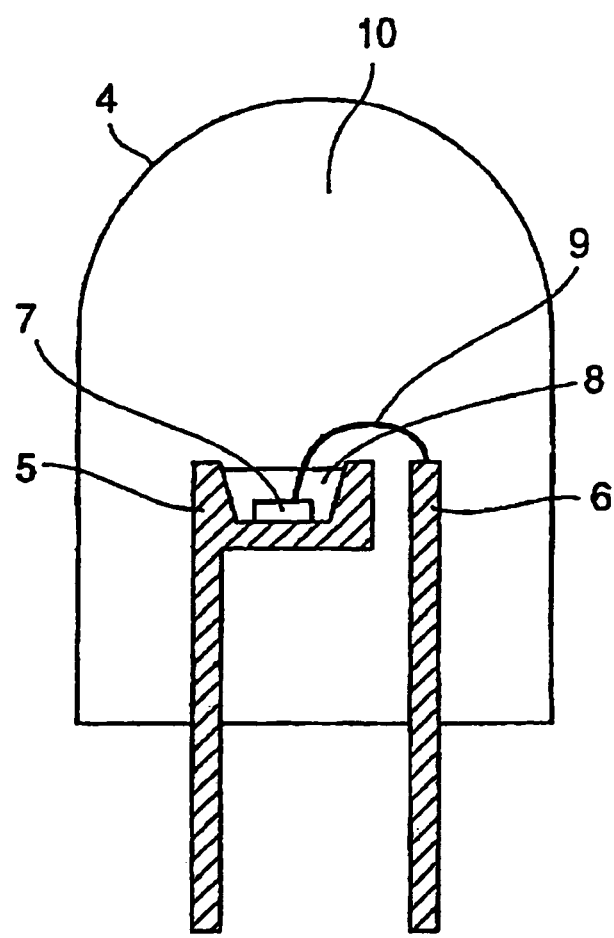
FIG. 3 is a schematic sectional view showing one embodiment of the light-emitting device of the present invention comprising a first illuminant (illuminant of from 420 to 500 nm) and a second illuminant.

Now, the light-emitting device of the present invention will be described with reference to the drawings. FIG. 3 is a schematic cross-sectional view which illustrates one embodiment of the light-emitting device having a first illuminant (illuminant having a wavelength of from 420 to 500 nm) and a second illuminant, wherein reference numeral 4 represents a light-emitting device, numeral 5 a mount lead, numeral 6 an inner lead, numeral 7 a first illuminant (illuminant having a wavelength of from 420 to 500 nm), numeral 8 a phosphor-containing resin portion as the second illuminant, numeral 9 a conductive wire and numeral 10 a mold member.

The light-emitting device as one embodiment of the present invention has a common bullet shape as shown in FIG. 3. In the cup at the upper part of the mount lead 5, the first illuminant 7 (illuminant having a wavelength of from 420 to 500 nm) made of a GaN type light-emitting diode or the like is fixed as covered with a phosphor-containing resin portion 8 formed as the second illuminant, which is formed in such a manner that the phosphor is mixed and dispersed in a binder of e.g. an epoxy resin or an acryl resin and cast into the cup. On the other hand, the first illuminant 7 and the mount lead 5, and the first illuminant 7 and the inner lead 6 are respectively connected by the conductive wires 9, and all of them are covered and protected with the mold member 10 of an epoxy resin.

Figure 4:
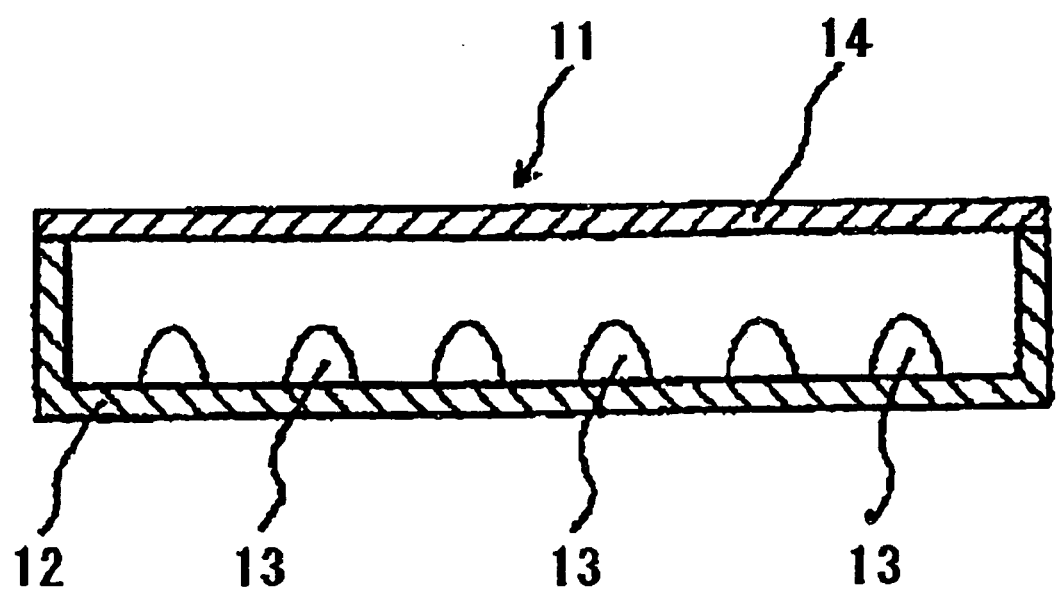
FIG. 4 is a schematic sectional view showing one embodiment of a surface-emitting illumination device of the present invention.

Further, as shown in FIG. 4, a surface-emitting illumination device 11 having such emission elements 13 mounted therein is prepared in such a manner that a plurality of emitting devices 13 are disposed on a bottom surface of a quadrate-shaped casing 12 having an interior surface made light-impermeable with e.g. a white smooth surface, and a power source, a circuit, etc. (not shown) for driving the light-emitting devices 13 are disposed outside thereof, and then a diffuser panel 14 such as a milky white acrylic sheet is fixed for uniform emission at a portion corresponding to the cover of the casing 12.

Such a surface-emitting illumination device 11 is driven to apply a voltage to the first illuminant of such emission elements 13 to emit a light having a wavelength of from 350 to 480 nm, and such an emission is partly absorbed by the above phosphor in the phosphor-containing resin portion as the second illuminant to emit a visible light. Further, an emission having high color rendering properties can be obtained by color mixing of the visible light with e.g. a blue light which is not absorbed by the phosphor. This light is emitted upward in the drawing through the diffuser panel 14, whereby an illumination light having a uniform brightness can be obtained in the in-plane of the diffuser panel 14 of the casing 12.

Now, the present invention will be described in further detail with reference to Examples. However, it should be understood that the present invention is by no means restricted to the following Examples.

Here, in the following Examples, the object color of the phosphor (L*, a*, b*), emission spectrum, total luminous flux, temperature characteristic and afterglow characteristic were measured by the following methods.

Object Color

A powder of a phosphor was packed in a cell having an aperture of 10 mmΦ, a chromatic measurement was carried out in a standard illuminant D65 irradiation mode by a color difference meter (CR-300 manufactured by Konica Minolta Holdings, Inc.) through a synthetic quartz plate having a thickness of 1 mm, to obtain L*, a* and b*.

Emission Spectrum

A phosphor was applied on a blue GaN type light-emitting diode chip having a main wavelength of 465 nm, and the emission spectrum when the phosphor was excited, was measured by using a spectrometer (manufactured by Ocean Photonics, Inc.).

Total Luminous Flux

Measurement was carried out by using a spectrometer (manufactured by Ocean Photonics, Inc.) and a 1-inch integrating sphere in combination.

Temperature Characteristic

A phosphor-temperature evaluation device (manufactured by Koyo Denshi K.K.) was used. The emission intensity was measured by using MCPD-7000 manufactured by Otsuka Electronics Co., Ltd.

Afterglow Characteristic

Measurement was carried out in such a manner that by using a nitrogen laser (pulse width: 5 ns, repeat: 10 Hz, wavelength: 337 nm) as an excitation source, a phosphor was excited at an excitation light intensity of 4 μW/cm², an emission from the phosphor was spectroscoped by a spectroscope C5094 manufactured by Hamamatsu Photonics K.K. and then, time decomposition measurement was carried out by a streak camera C4334 manufactured by Hamamatsu Photonics K.K.

With respect to such a time decomposition measurement value, an instrumental function represented by a gauss function and an attenuation of the emission represented by two exponential functions are subjected to a function-fitting operation by applying non-linear least-squares fitting by "convolution+constant term" to calculate time constants T1 and T2 of exponential functions, their intensity elements A1 and A2, and a constant term C. By using such T1, T2, A1, A2 and C, it is possible to obtain the change with time of the emission intensity I(t) represented by the formula (1), and it is possible to obtain afterglow characteristics which do not depend on the instrumental function. The 1/10 afterglow time (t1) was obtained from the time t when the intensity became 1/10 of the value of the formula (1) when t=0 (the emission intensity immediately before termination of excitation), and a 1/100 afterglow time (t2) was obtained from the time t when the intensity became 1/100 of the value of the formula 1 when t=0.

$$I(t)=A1*\exp(-t/T1)+A2*\exp(-t/T2)+C \quad (1)$$

EXAMPLES

Example 1

By using 1.26 mol of $Y_2O_3$ as a Ln source compound, 2.5 mol of $\gamma$-$Al_2O_3$ as a M source compound, 0.33 mol of $CeO_2$ as a Ce source compound, 0.0375 mol of $Tb_4O_7$ as a Tb source compound and 0.25 mol of $BaF_2$ as a fluxing agent, such starting materials were mixed sufficiently, and then firing was carried out at 1,450° C. for 2 hours in a nitrogen stream containing 4% of hydrogen in a crucible made of alumina. The obtained fired product was pulverized, washed with acid, and washed with water to remove $BaF_2$. Then, drying and classification treatment were carried out to produce a yellow emission phosphor $(Y_{0.84}Ce_{0.11}Tb_{0.05})_3Al_5O_{12}$.

The object color of the phosphor obtained was L*=103.1, a*=−18.1 and b*=73.0. Then, the emission spectrum of the phosphor was measured. Such an emission spectrum is shown in FIG. 1. The measured value of the total luminous flux was 141%, on such a basis that the corresponding value when the phosphor obtained in the after-mentioned Comparative Example 1 was used, was regarded as 100%. The temperature characteristic was 99%. Further, 1/10 afterglow time (t1) was 161 ns, and t2/t1 was 2.11. The results are shown in Table 1.

Example 2

A yellow emission phosphor $(Y_{0.79}Ce_{0.04}Tb_{0.17})_3Al_5O_{12}$ was prepared in the same manner as in Example 1 except that 1.185 mol of $Y_2O_3$ as a Ln source compound, 2.5 mol of $\gamma$-$Al_2O_3$ as a M source compound, 0.12 mol of $CeO_2$ as a Ce source compound, 0.1275 mol of $TbO_7$ as a Tb source compound and 0.25 mol of $BaF_2$ as a fluxing agent were used, and the firing temperature was 1,380° C. The obtained phosphor was evaluated in the same manner as in Example 1, and the object color was L*=102.4, a*=−17.0 and b*=68.4, the total luminous flux was 131%, and the temperature characteristic was 97%. Further, t1 was 183 ns, and t2/t1 was 2.32. The results are shown in Table 1.

Example 3

A yellow emission phosphor $(Y_{0.45}Ce_{0.11}Tb_{0.44})_3Al_5O_{12}$ was prepared in the same manner as in Example 1 except that 0.675 mol of $Y_2O_3$ as a Ln source compound, 2.5 mol of $\gamma$-$Al_2O_3$ as a M source compound, 0.33 mol of $CeO_2$ as a Ce source compound, 0.33 mol of $TbO_7$ as a Tb source compound and 0.25 mol of $BaF_2$ as a fluxing agent were used, and the firing temperature was 1,420° C. Thus obtained phosphor was evaluated in the same manner as in Example 1, and the object color was L*=98.9, a*=−14.0 and b*=80.0, the total luminous flux was 128%, and the temperature characteristic was 92%. Further, t1 was 206 ns, and t2/t1 was 3.29. The results are shown in Table 1.

Example 4

A yellow emission phosphor $(Y_{0.7}Gd_{0.26}Ce_{0.04})_3Al_5O_{12}$ was prepared in the same manner as in Example 1 except that 1.05 mol of $Y_2O_3$ and 0.39 mol of $Gd_2O_3$ as a Ln source compound, 2.5 mol of $\gamma$-$Al_2O_3$ as a M source compound, 0.12 mol of $CeO_2$ as a Ce source compound and 0.25 mol of $BaF_2$ as a fluxing agent were used. The obtained phosphor was evaluated in the same manner as in Example 1, and the object color was L*=102.4, a*=−12.5 and b*=62.3, the total luminous flux was 120%, and the temperature characteristic was 90%. The results are shown in Table 1.

Example 5

An yellow emission phosphor $(Y_{0.96}Ce_{0.03}Tb_{0.01})_3Al_5O_{12}$ was prepared in the same manner as in Example 1 except that 1.44 mol of $Y_2O_3$ as a Ln source compound, 2.5 mol of $\gamma$-$Al_2O_3$ as a M source compound, 0.09 mol of $CeO_2$ as a Ce source compound 0.0075 mol of $Tb_4O_7$ as a Tb source compound and 0.25 mol of $BaF_2$ as a fluxing agent were used, and firing was carried out at 1,400° C. in a nitrogen stream. The object color and the total luminous flux of the phosphor obtained were evaluated in the same manner as in Example 1, and such an object color was L*=102.7, a*=−14.9 and b*=58.8, and the total luminous flux was 116%. The results are shown in Table 1.

Example 6

A yellow emission phosphor $(Y_{0.96}Ce_{0.04})_3Al_5O_{12}$ was prepared in the same manner as in Example 1 except that 1.44 mol of $Y_2O_3$ as a Ln source compound, 2.5 mol of $\gamma$-$Al_2O_3$ as a M source compound, 0.12 mol of $CeO_2$ as a Ce source compound and 0.25 mol of $BaF_2$ as a fluxing agent were used, and the firing was carried out at 1,400° C. in a nitrogen stream. The evaluation was carried out in the same manner as in Example 1, and the object color was L*=101.2, a*=−14.7 and b*=57.8, the total luminous flux was 110%, and the temperature characteristics was 98%. Further, t1 was 151 ns, t2/t1 was 2.03. The results are shown in Table 1.

Example 7

A yellow emission phosphor $(Y_{0.8}Ce_{0.1}Tb_{0.1})_3Al_5O_{12}$ was prepared in the same manner as in Example 1 except that 1.2 mol of $Y_2O_3$ as a Ln source compound, 2.5 mol of $\alpha$-$Al_2O_3$ as a M source compound, 0.3 mol of $CeO_2$ as a Ce source compound, 0.075 mol of $Tb_4O_7$ as a Tb source compound and 0.2 mol of $BaF_2$ as a fluxing agent were used, and the firing was carried out at 1,450° C. for three hours in a nitrogen stream containing 4% of hydrogen. The object color and the total luminous flux of the phosphor obtained were measured in the same manner as in Example 1, and the object color was L*=105.8, a*=−15.3 and b=95.6, and the total luminous flux was 137. The results are shown in Table 1.

Comparative Example 1

A yellow emission phosphor $(Y_{0.7}Gd_{0.26}Ce_{0.04})_3Al_5O_{12}$ was prepared in the same manner as in Example 1 except that 1.05 mol of $Y_2O_3$ and 0.39 mol of $Gd_2O_3$ as a Ln source compound, 2.5 mol of $\gamma$-$Al_2O_3$ as a M source compound, 0.12 mol of $CeO_2$ as a Ce source compound and 0.25 mol of $BaF_2$ as a fluxing agent were used, and the firing was carried out in the atmosphere. The evaluation was carried out in the same manner as in Example 1, and the object color was L*=100.0, a*=−13.3 and b*=51.4, and the total luminous flux was 100%, and the temperature characteristic was 86%. Further, t1 was 147 ns, and t2/t1 was 2.04. The results are shown in Table 1.

Comparative Example 2

An yellow emission phosphor $(Y_{0.96}Ce_{0.03}Tb_{0.01})_3Al_5O_{12}$ was prepared in the same manner as in Example 1 except that 1.44 mol of $Y_2O_3$ as a Ln source compound, 2.5 mol of $\gamma$-$Al_2O_3$ as a M source compound, 0.09 mol of $CeO_2$ as a Ce source compound, 0.0075 mol of $Tb_4O_7$ as a Tb source compound and 0.25 mol of $BaF_2$ as a fluxing agent were used, and the firing was carried out at 1,400° C. in a nitrogen stream. The object color and the total luminous flux were measured in the same manner as in Example 1, and the object color was L*=96.0, a*=−7.6 and b*=38.4, and the total luminous flux was 78%. The results are shown in Table 1.

Comparative Example 3

A yellow emission phosphor $(Y_{0.96}Ce_{0.03}Tb_{0.01})_3Al_5O_{12}$ was prepared in the same manner as in Example 1 except that 1.44 mol of $Y_2O_3$ as a Ln source compound, 2.5 mol of $\gamma$-$Al_2O_3$ as a M source compound, 0.09 mol of $CeO_2$ as a Ce source compound, 0.0075 mol of $Tb_4O_7$ as a Tb source compound and 0.25 mol of $BaF_2$ as a fluxing agent were used, and the firing was carried out at 1,400° C. in a nitrogen stream containing 2.5% of hydrogen. The object color and the total luminous flux were measured in the same manner as in Example 1, and the object color was L*=99.0, a*=−11.7 and b*=53.4, and the total luminous flux was 100%. The results are shown in Table 1.

Comparative Example 4

A yellow emission phosphor $(Y_{0.96}Ce_{0.03}Tb_{0.01})_3Al_5O_{12}$ was prepared in the same manner as in Example 1 except that 1.44 mol of $Y_2O_3$ as a Ln source compound, 2.5 mol of $\gamma$-$Al_2O_3$ as a M source compound, 0.09 mol of $CeO_2$ as a Ce source compound, 0.0075 mol of $Tb_4O_7$ as a Tb source compound and 0.25 mol of $BaF_2$ as a fluxing agent were used, and the firing was carried out at 1,400° C. together with carbon beads in a nitrogen stream containing 4% of hydrogen. The object color and the total luminous flux were measured in the same manner as in Example 1, and the object color was L*=95.0, a*=−14.7 and b*=50.4, and the total luminous flux was 90%. The results are shown in Table 1.

Comparative Example 5

A yellow emission phosphor $(Ce_{0.11}Tb_{0.89})_3Al_5O_{12}$ was prepared in the same manner as in Example 1 except that 0.6675 mol of $Tb_4O_7$ as a Ln source compound, 2.5 mol of $\gamma$-$Al_2O_3$ as a M source compound, 0.33 mol of $CeO_2$ as a Ce source compound and 0.25 mol of $BaF_2$ as a fluxing agent were used. The evaluation was carried out in the same manner as in Example 1, and the object color was L*=95.2, a*=−9.8 and b*=77.8, the total luminous flux was 104%, and the temperature characteristic was 88%. The results are shown in Table 1.

TABLE 1

| | | Object color | | | Total luminous | Temperature characteristics | Afterglow characteristics | | |
|---|---|---|---|---|---|---|---|---|---|
| | Composition of phosphor | L* | a* | b* | flux (%) | (%) | t1 (ns) | t2 (ns) | t1/t2 |
| Ex. 1 | $(Y_{0.84}Ce_{0.11}Tb_{0.05})_3Al_5O_{12}$ | 103.1 | −18.1 | 73.0 | 141 | 99 | 161 | 339 | 2.11 |
| Ex. 2 | $(Y_{0.79}Ce_{0.04}Tb_{0.17})_3Al_5O_{12}$ | 102.4 | −17.0 | 68.4 | 131 | 97 | 183 | 425 | 2.32 |
| Ex. 3 | $(Y_{0.45}Ce_{0.11}Tb_{0.44})_3Al_5O_{12}$ | 98.9 | −14.0 | 80.0 | 128 | 92 | 206 | 677 | 3.29 |
| Ex. 4 | $(Y_{0.7}Gd_{0.26}Ce_{0.04})_3Al_5O_{12}$ | 102.4 | −12.5 | 62.3 | 120 | 90 | — | — | — |
| Ex. 5 | $(Y_{0.96}Ce_{0.03}Tb_{0.01})_3Al_5O_{12}$ | 102.7 | −14.9 | 58.8 | 116 | — | — | — | — |
| Ex. 6 | $(Y_{0.96}Ce_{0.04})_3Al_5O_{12}$ | 101.2 | −14.7 | 57.8 | 110 | 98 | 151 | 307 | 2.03 |
| Ex. 7 | $(Y_{0.8}Ce_{0.1}Tb_{0.1})_3Al_5O_{12}$ | 105.8 | −15.3 | 95.6 | 137 | — | — | — | — |
| Comp. Ex. 1 | $(Y_{0.7}Gd_{0.26}Ce_{0.04})_3Al_5O_{12}$ | 100.0 | −13.3 | 51.4 | 100 | 86 | 147 | 300 | 2.04 |
| Comp. Ex. 2 | $(Y_{0.96}Ce_{0.03}Tb_{0.01})_3Al_5O_{12}$ | 96.0 | −7.6 | 38.4 | 78 | — | — | — | — |
| Comp. Ex. 3 | $(Y_{0.96}Ce_{0.03}Tb_{0.01})_3Al_5O_{12}$ | 99.0 | −11.7 | 53.4 | 100 | — | — | — | — |
| Comp. Ex. 4 | $(Y_{0.96}Ce_{0.03}Tb_{0.01})_3Al_5O_{12}$ | 95.0 | −14.7 | 50.4 | 90 | — | — | — | — |
| Comp. Ex. 5 | $(Ce_{0.11}Tb_{0.89})_3Al_5O_{12}$ | 95.2 | −9.8 | 77.8 | 104 | 88 | — | — | — |

From the results of Table 1, it is found that in all of Examples 1 to 7 of the invention, the total luminous flux is at least 100%, based on the total luminous flux in Comparative Example 1 (100%).

Especially, from the comparison between Example 4 and Comparative Example 1, having the same composition of the phosphor, it is found that the total luminous flux is increased by 20%. Further, Example 5 and Comparative Example 2 also have the same composition of the phosphor, but it is found that the Example of the present invention has a much higher total luminous flux.

The entire disclosures of Japanese Patent Application No. 2003-305020 filed on Aug. 28, 2003 and Japanese Patent Application No. 2003-361114 filed on Oct. 21, 2003 including specifications, claims, drawings and summaries are incorporated herein by reference in their entireties.

What is claimed is:

1. A light-emitting device having a first illuminant which emits a light having a wavelength of 420 to 500 nm and a second illuminant which emits a visible light when irradiated with the light from the first illuminate, wherein the second illuminate contains a phosphor, wherein the phosphor contains a crystal phase having a chemical composition of the following formula [1], and the object color of the phosphor satisfies L*≧90, −22≦a*≦−10, and b*≧55, in the L8, a*,b* color system:

$(Ln_{1-a-b}Ce_aTb_b)_3M_5O_{12}$  Formula [1]

wherein Ln is at least one element selected from the group consisting of Y,Gd,Sc,Lu and La, M is at least one element elected from the group consisting of Al, Ga and In and a and b are numbers which satisfy 0.00≦a≦0.3 and 0≦b≦0.5, respectively.

2. The light-emitting device according to claim 1, wherein in the formula [1], a satisfies 0.01≦a≦0.2.

3. The light-emitting device according to claim 1, wherein the first illuminant is a laser diode or a light-emitting diode.

4. The light-emitting device according to claim 3, wherein the first illuminant is a light-emitting diode.

5. The light-emitting device according to claim 1, wherein the first illuminant employs a GaN type compound semiconductor.

6. The light-emitting device according to claim 1, wherein the first illuminant is a surface-emitting GaN type laser diode.

7. The light-emitting device according to claim 1, wherein the second illuminant is in a film form.

8. The light-emitting device according to claim 7, wherein the film surface of the second illuminant is contacted directly to the emission surface of the first illuminant.

9. The light-emitting device according to claim 1, wherein the second illuminant contains another phosphor, and the light-emitting device emits white light.

10. The light-emitting device according to claim 1, wherein the second illuminant is one having a powder of the phosphor dispersed in a resin.

11. The light-emitting device according to claim 1, which is an illumination device.

12. An image display device comprising, as a light-emitting source, the light-emitting device according to claim 1.

13. A phosphor which has an object color satisfying L*>90, −22<a*<−10, and b*>55, in the L*, a*, b* color system, and which contains a crystal phase having a chemical composition of the following formula [1]:

$(Ln_{1-a-b}Ce_aTb_b)_3M_5O_{12}$  Formula [1]

wherein Ln is at least one element selected from the group consisting of Y, Gd, Sc, Lu and La, M is at least one element selected from the group consisting of Al, Ga and In, and a and b are numbers which satisfy 0.001<a<0.3, and 0<b<0.5, respectively.

14. The phosphor according to claim 13, which produces a yellow emission.

* * * * *

UNITED STATES PATENT AND TRADEMARK OFFICE
CERTIFICATE OF CORRECTION

PATENT NO. : 7,332,106 B2
APPLICATION NO. : 11/361981
DATED : February 19, 2008
INVENTOR(S) : Masahiko Yoshino et al.

It is certified that error appears in the above-identified patent and that said Letters Patent is hereby corrected as shown below:

Column 13, lines 53-67, "1. A light-emitting device having a first illuminant which emits a light having a wavelength of 420 to 500 nm and a second illuminant which emits a visible light when irradiated with the light from the first illuminate, wherein the second illuminate contains a phosphor, wherein the phosphor contains a crystal phase having a chemical composition of the following formula [1], and the object color of the phosphor satisfies $L^* \geq 90$, $-22 \leq a^* \leq -10$, and $b^* \geq 55$, in the L8, a*, b* color system:

$(Ln_{1-a-b}Ce_aTb_b)_3M_5O_{12}$  Formula [1]

wherein Ln is at least one element selected from the group consisting of Y,Gd,Sc,Lu and La, M is at least one element selected from the group consisting of Al, Ga and In and a and b are numbers which satisfy $0.00 \leq a \leq 0.3$, and $0 \leq b \leq 0.5$, respectively."

should read --1. A light-emitting device, wherein a phosphor contains a crystal phase having a chemical composition of the following formula [1], and the object color of the phosphor satisfies $L^* \geq 90$, $-22 \leq a^* \leq -10$, and $b^* \geq 55$, in the L*, a*, b* color system:

$(Ln_{1-a-b}Ce_aTb_b)_3M_5O_{12}$  Formula [1]

wherein Ln is at least one element selected from the group consisting of Y, Gd, Sc, Lu and La, M is at least one element selected from the group consisting of Al, Ga and In, and a and b are numbers which satisfy $0.001 \leq a \leq 0.3$, and $0 \leq b \leq 0.5$, respectively.--.

UNITED STATES PATENT AND TRADEMARK OFFICE
CERTIFICATE OF CORRECTION

PATENT NO. : 7,332,106 B2
APPLICATION NO. : 11/361981
DATED : February 19, 2008
INVENTOR(S) : Masahiko Yoshino et al.

It is certified that error appears in the above-identified patent and that said Letters Patent is hereby corrected as shown below:

Column 14, line 54, "$L^* > 90, -22 < a^* < 10,$ and $b^* > 55$"

should read --$L^* \geqq 90, -22 \leqq a^* \leqq -10,$ and $b^* \geqq 55$--.

Column 14, line 63, "$0.001 < a < 0.3,$ and $0 < b < 0.5$"

should read --$0.001 \leqq a \leqq 0.3,$ and $0 \leqq b \leqq 0.5$--.

Signed and Sealed this

Second Day of September, 2008

JON W. DUDAS
*Director of the United States Patent and Trademark Office*